United States Patent
Götz (10) Patent No.: US 10,155,489 B2
(45) Date of Patent: Dec. 18, 2018

(54) METHOD FOR CONTROLLING A POWER ELECTRONICS SYSTEM

(71) Applicant: Dr. Ing. h.c. F. Porsche Aktiengesellschaft, Stuttgart (DE)

(72) Inventor: Stefan Götz, Forstern (DE)

(73) Assignee: Dr. Ing. h.c. F. Porsche Aktiengesellschaft, Stuttgart (DE)

( * ) Notice: Subject to any disclaimer, the term of this patent is extended or adjusted under 35 U.S.C. 154(b) by 184 days.

(21) Appl. No.: 15/427,390

(22) Filed: Feb. 8, 2017

(65) Prior Publication Data

US 2017/0294901 A1 Oct. 12, 2017

(30) Foreign Application Priority Data

Apr. 8, 2016 (DE) .................. 10 2016 106 472

(51) Int. Cl.
*B60R 16/03* (2006.01)
*H03K 5/04* (2006.01)

(52) U.S. Cl.
CPC ............... *B60R 16/03* (2013.01); *H03K 5/04* (2013.01)

(58) Field of Classification Search
CPC .................................. B60R 16/03; H03K 5/04
See application file for complete search history.

(56) References Cited

U.S. PATENT DOCUMENTS

| 5,515,285 A * | 5/1996 | Garrett, Sr. ........... B60R 25/102 340/426.2 |
|---|---|---|
| 5,901,176 A | 5/1999 | Lewison |
| 6,559,698 B1 | 5/2003 | Miyabe |
| 7,589,432 B2 | 9/2009 | Kawasaki |
| 2001/0015904 A1 | 8/2001 | Kimura |
| 2003/0173855 A1 | 9/2003 | Morales Serrano |
| 2003/0174081 A1 | 9/2003 | Bruckmann |
| 2005/0254265 A1 | 11/2005 | Yamada |
| 2009/0033374 A1 | 2/2009 | Lesso |
| 2014/0126252 A1 | 5/2014 | Geyer |

FOREIGN PATENT DOCUMENTS

| DE | 102006014898 | 10/2006 |
|---|---|---|
| WO | 2015155183 | 10/2015 |

OTHER PUBLICATIONS

German Search Report for German Application No. 10 2016 106 472.6, dated Dec. 8, 2016, 8 pages.

* cited by examiner

*Primary Examiner* — Daniel Cavallari-See
(74) *Attorney, Agent, or Firm* — RatnerPrestia

(57) ABSTRACT

Method for controlling a power electronics system for a vehicle in which, while maintaining a current timing of a modulator of the power electronics system, one switching state of the power electronics system from a number of possible switching states of the power electronics system is selected in dependence on at least one requirement, to be provided in advance, for spectral characteristics of an error signal of an output voltage of the power electronics system and is set in the power electronics system.

13 Claims, 5 Drawing Sheets

METHOD FOR CONTROLLING A POWER ELECTRONICS SYSTEM

CROSS-REFERENCE TO RELATED APPLICATIONS

This application claims priority to German Patent Application No. DE 10 2016 106 472.6, filed Apr. 8, 2016, which is incorporated by reference herein in its entirety.

FIELD OF THE INVENTION

The present invention relates to a method for controlling a power electronics system for a vehicle and a modulator suitable for performing the method presented.

BACKGROUND OF THE INVENTION

When using power electronics for controlling, e.g., electric motors, power semiconductors comprised in a respective power electronics system are switched at a high frequency in order to map various states of the power electronics system. Due to the switching of the power semiconductors, the power electronics system generates an error signal which can interact in its frequency with other electric devices such as, e.g., a radio receiver as a result of which interfering noises or noise effects can be produced. Particularly in the case of control systems of respective power semiconductors by means of pulse-width modulators, harmonic oscillations frequently occur which act as error signals on other electric devices.

In order to reduce an influence of circuit-related spectral changes of power electronics, methods are described in the prior art in which a timing of a modulator for switching respective power semiconductors of respective power electronics is changed.

In U.S. 2001 0015 904 A1, which is incorporated by reference herein, a method for reducing switching losses when switching power semiconductors of a power electronics system is disclosed. In this context, control signals for respective power semiconductors are determined in dependence on voltages of respective motor phases.

U.S. 2003 0174 081 A1, which is incorporated by reference herein, discloses an inverter with a switching module for controlling respective power semiconductors of the inverter.

In U.S. 2005 0254 265 A1, which is incorporated by reference herein, a method for controlling an output voltage of a voltage converter is found which converts the direct voltage into an output voltage specified by a control unit.

In U.S. 2009 0033 374 A1, which is incorporated by reference herein, a frequency divider and a method for widening the frequency of a spectrum of a current converter in which an additional signal is modulated onto an original clock frequency, is found.

In U.S. Pat. No. 5,901,176 A, which is incorporated by reference herein, a pulse width modulator based on a sigma/delta modulator is disclosed.

In U.S. Pat. No. 6,559,698 B1, which is incorporated by reference herein, a circuit for controlling a clock rate on the basis of a signal provided by an oscillator is disclosed.

SUMMARY OF THE INVENTION

Against this background, the claimed method and/or device provides a possibility for controlling an error signal generated by a power electronics system while maintaining a clock rate for switching respective power semiconductors of the power electronics system.

A method for controlling a power electronics system for a vehicle is presented in which, while maintaining a current timing of a modulator of the power electronics system, one switching state of the power electronics system from a number of possible switching states of the power electronics system is selected in dependence on at least one requirement, to be provided in advance, for spectral characteristics of an error signal of an output voltage of the power electronics system and is set in the power electronics system.

The method presented is used particularly for controlling a power electronics system in such a manner that spectral characteristics, i.e. amplitudes of respective frequencies, of an output voltage or of an error signal of the output voltage of the power electronics system are adapted in accordance with a predetermined requirement. For this purpose, it is provided particularly that in a respective spectrum of an error signal, i.e. a distortion of the output voltage of the power electronics system which is or are produced by a change of switching states of the power electronics system, at least one spectral gap is generated. Such gaps are typical, e.g., of notch filters and correspondingly strongly reduced amplitudes in a respective selected frequency range.

Within the context of the invention presented, spectral characteristics are understood to be, in particular, amplitudes of a respective frequency spectrum of an error signal of the output voltage of a respective power electronics system. Since the amplitudes of the frequency spectrum of the output voltage of the error signal of the power electronics system change in dependence on changes of switching states of the power semiconductors of the power electronics system, spectral characteristics are also understood to be amplitudes of a frequency spectrum of an error signal of respective power semiconductors of the power electronics system.

A modulator is understood to be a module for controlling switching times of respective power semiconductors of a power electronics system, particularly a pulse width modulator, in the context of the present invention.

Naturally, using the method presented, it can also be provided to adapt the spectral characteristics of a respective power electronics system or of respective power semiconductors of the power electronics system in that from the number of possible switching states of the power electronics system, the switching state is selected which changes a spectrum of the error signal of the output voltage of the power electronics system compared with a current switching state of the power electronics in such a manner that a selected range is attenuated with a particular factor, i.e. reduced in its amplitude, and as a result an influence of corresponding frequencies of the selected range on further electronic devices is reduced, especially minimized.

In order to attenuate or to minimize an influence of respective frequencies of an error signal of an output voltage of a power electronics system to other electronic devices it is provided, in particular, that, starting from a number of past switching states of the power electronics system, a frequency spectrum of a corresponding error signal is calculated or simulated for a number of current and/or future switching states of the power electronics system. Starting from the simulated frequency spectra of the number of switching states, the switching state of the power electronics system can be selected which meets a respective requirement in the best possible manner, i.e. which produces an error signal of an output voltage of the power electronics system which meets the requirement in its spectral characteristics or shows the least deviation from the requirement among all alternative switching states. As soon as the switching state which meets the respective requirement in the best possible manner exists, the power electronics system can be correspondingly set, i.e. the respective power semiconductors of the power electronics system can be switched correspondingly as a result of which an average switching rate of the power semiconductors is adjusted at the same time.

Due to selection of switching states of the power electronics system, adapted to respective requirements, the method presented enables corresponding adaptation of error signals generated by a power electronics system or of respective spectral characteristics of the error signals, respectively, of an output voltage of the power electronics system even without a system clock of a control of the power electronics system having to be changed or modulated.

In a possible embodiment of the method presented, it is provided that the at least one requirement is chosen in dependence on a current position of the vehicle.

Since requirements for electrical devices such as, e.g., CISPR limit values can change in dependence on country standards, i.e. in dependence on a current position of a respective vehicle, it is provided in an embodiment to select respective requirements for a frequency spectrum of an error signal of a switching state of a power electronics system, to be selected, in dependence on a current position of the vehicle which is determined, e.g., by means of a GPS sensor.

Naturally, it is also conceivable that the respective requirements are adapted dynamically to changes of respective third-party devices such as, e.g., to a radio transmitter adjusted to a radio receiver. For this purpose, e.g., spectral gaps in a frequency spectrum of an error signal of an output voltage of a respective power electronics system tracking, e.g., a frequency band set on the radio transmitter, i.e. changing in accordance with a current setting of the radio transmitter, can be used as a basis for selecting respective requirements. This means that switching states of a power electronics system are selected in dependence on a requirement which changes dynamically, e.g. according to a radio transmitter currently set or in accordance with a current search window of a radio receiver.

In a further possible embodiment of the method presented it is provided that the at least one requirement is chosen in dependence on at least one vehicle parameter of the vehicle.

Apart from changes of third-party devices such as, e.g., radio receivers, changes of vehicle parameters such as, e.g., a speed, can be used for the selection or for changing a respective requirement, respectively.

In a further possible embodiment of the method presented, it is provided that the at least one requirement is specified by a device comprised by the vehicle and/or by a device allocated by a user.

Since devices allocated to a respective user such as, e.g., smartphones, are susceptible to interference signals, it is provided in an embodiment of the method presented that respective requirements by a device allocated to a user are specified per se or in combination with another device such as, e.g., a radio receiver of a respective vehicle or used for selection of respective requirements, respectively. Correspondingly, a requirement can be designed in this respect that frequencies generated by a power electronics system which are superimposed on a receiving frequency band of the radio receiver of, e.g., 101 MHz, i.e. frequencies in the range of 90 MHz to 110 MHz show amplitudes as low as possible.

In a further possible embodiment of the method presented it is provided that all possible switching states of the power electronics system are simulated and checked for their influence on a change of a frequency spectrum of an error signal in a predetermined time domain of the at least one power semiconductor, wherein, from the simulated switching states, that switching state is selected for implementation in the power electronics system and set in the power electronics system which produces a change in the frequency spectrum coming closest to the at least one requirement.

For the selection of a switching state of a power electronics system to be set at a respective power electronics system from a number of simulated switching states, it is provided that all potentially available switching states are simulated and by means of a calibration of spectral characteristics of error signals of corresponding output voltages of the power electronics system and a predetermined requirement, that switching state is selected from the simulated switching states and set in the power electronics system which meets the requirement in the best possible way, i.e. produces an output voltage at the power electronics system which meets the requirement in the best possible way. For a simulation of all available switching states of a power electronics system, respective power semiconductors can be considered in all possible switching states and in all combinations with all other power semiconductors of a power electronics system. A switching state of a power electronics system indicates particularly a state of all power semiconductors of the corresponding power electronics system.

In a further possible embodiment of the method presented, it is provided that the error signal of each simulated switching state of the power electronics system is preprocessed by means of a sigma/delta modulation in order to determine a suitability of a respective switching state for meeting the at least one requirement, an exponentially decreasing window function being chosen as integrator element of the sigma/delta modulation in order to reduce an influence of respective past switching processes or switching states of the at least one power electronics system on the change of the error signal of the power electronics system and, in particular, to suppress oscillations in the error signal.

By means of an exponentially decreasing window function as integrator element of a sigma/delta modulation, it is possible to reduce an influence of past switching states of the power electronics system and as a result to increase a stability of the preprocessing and to reduce an influence of oscillations, which frequently lead to disturbances in third-party devices, on the sigma/delta modulation. The switching states of the power electronics system are here defined by the respective switching states of the individual power semiconductors of the power electronics system being viewed together or acting together, respectively. To illustrate this approach, the integrator element can be interpreted as a filter by which the error signal is weighted in order to form a spectral punitive term which attenuates the values of amplitudes of selected frequencies such as, e.g., those of high frequencies. In this context, the filter can correspond especially to a target spectrum according to a respective requirement, the punitive term being chosen in such a manner that respective frequencies are attenuated in such a manner that a correspondingly filtered spectrum approximates the target spectrum in the best possible way in that, e.g., oscillations in the error signal are minimized.

In a further possible embodiment of the method presented, it is provided that in the case that a number of requirements are specified, a target spectrum is determined by means of at least one predetermined weighting factor, which target spectrum is used as specification for a selection of a respective switching state of the power electronics system from the possible simulated switching states of the power electronics system.

By means of one or more weighting factors, different or even contradictory requirements can be taken into consideration at the same time as shown, for example, by equation (1). In the context, the two requirements "minimum switching losses" and "high accuracy", which, as a rule, act in opposite directions, are weighted by means of weighting factors K and λ, so that both requirements can be taken into consideration jointly or at the same time, respectively, in the selection of a respective switching state of a power electronics system.

$$\arg\min_{s}\left(K\left\|\int\frac{\tilde{\varepsilon}_s(\omega)}{F(\omega)}d\omega\right\|_p + \frac{\lambda}{T}\int\mathrm{abs}\left(\frac{d}{dt}\tilde{y}_s(t)\right)dt\right) \quad (1)$$

In this context, $$\int\mathrm{abs}\left(\frac{d}{dt}\tilde{y}_s(t)\right)dt$$

stands for a density of respective switching actions which corresponds to a density of respective switching losses, λ and K stand for weighting factors or compensating parameters by means of which balancing is achieved between respective requirements, $$\int\frac{\tilde{\varepsilon}_s(\omega)}{F(\omega)}d\omega$$

and stands for a spectral deviation or an error signal, respectively. Furthermore, $F(\omega)$ stands for a target spectrum of the error signal, $\tilde{\varepsilon}_s(\omega)$ for a frequency-transformed, i.e. particularly Fourier-transformed error signal. Furthermore, equation (2) applies applies:

$$\tilde{\varepsilon}_s(\omega)=\mathrm{Fourieri}\{(\tilde{y}_s(\tilde{y}_s(t)-y_{target}(t))w(\tau-t)\} \quad (2)$$

In this context, (τ–t) stands for an exponentially flattening time window, $y_{target}(t)$ for an output profile aimed for and $\tilde{y}_s(t)$ for a quantified output signal in which tilde and the index s point to predicted values for a switching state following a current switching state of a respective power electronics system, the following applying, e.g., for s ∈ {1,1} for a 2-level inverter. Additional tuning actions are possible by means of the ρ standard.

In a further possible embodiment of the method presented, it is provided that the error signal of the at least one power semiconductor is preprocessed by means of a filter function in order to determine a suitability of a respective switching state for meeting the at least one requirement.

In order to determine a respective optimum switching state or a switching state best matching a respective requirement from a number of simulated switching states of a power electronics system, it is provided to examine the error signals of the simulated switching states with regard to their spectral characteristics and select them with regard to the respective requirement. For assessing the suitability of the respective switching state of a power electronics system for meeting the respective requirement, it is provided in an embodiment that the error signals of the simulated switching states of the power electronics system are preprocessed by means of a filter function. As the filter function, it is possible to choose, e.g., a band pass filter or band width filter or a notch-filter (notch filter or frequency blocking filter) which approximates a frequency spectrum of an error signal of a respective switching state of a power electronics system to a target parameter determined by the requirement in that, e.g., a particular frequency range is lowered in its amplitude.

By means of the preprocessing of the error signals of all simulated switching states of a power electronics system, a respective, best-suitable switching state can be identified and selected for setting at a respective power electronics system.

In a further possible embodiment of the method presented, it is provided that a cut-off function falling inversely proportionally for high frequencies at respective amplitudes of a number of selected frequencies is chosen as filter function.

By means of a cut-off function falling inversely proportionally for high frequencies or corresponding amplitudes of the high frequencies, it is possible to generate a filter characteristic typical of a band-pass filter. This means that by means of the cut-off function falling inversely proportionally for high frequencies, an edge of a spectrum of an error signal of a power semiconductor can be cut off or greatly reduced in its amplitude so that influences of the high frequencies are minimized. Applying a cut-off function to a spectrum of an error signal enables a predetermined frequency range of the spectrum to be "cut off" or to filter the spectrum in such a manner that the predetermined frequency range is attenuated in its corresponding amplitudes.

In a further possible embodiment of the method presented, it is provided, that selected values of the frequency spectrum are reduced in their amplitude below a predetermined threshold value by means of a mathematical function.

In order to avoid interfering frequencies for third-party devices such as, e.g., radio receivers of a vehicle during operation of a power electronics system, e.g. for controlling an electric motor, it is provided in an embodiment that selected frequencies or frequency ranges of, e.g., 40 Hz to 60 Hz are attenuated or reduced in their amplitude by means of mathematical function, such as, e.g., a filter function, i.e. weakened in their intensity. By weakening selected frequency ranges in their intensity, so-called "spectral gaps" are produced which, in particular, are chosen in such a way that they are placed into operating ranges of third-party devices in order to meet respective requirements of, e.g., the third-party devices. By means of a selective attenuation of selected frequencies it is possible to filter or to attenuate selected ranges of a respective frequency spectrum of an error signal of a switching state of the power electronics system so that disturbances in the third-party devices can be reduced or completely avoided.

Naturally, it is possible to filter or to attenuate a multiplicity of ranges in the respective frequency spectrum by means of the mathematical function, wherein respective ranges can also be chosen dynamically in dependence on a current setting of at least one third-party device of the vehicle.

In a further possible embodiment of the method presented, it is provided that an amplitude of 40 dB is chosen as threshold value.

From experience, a threshold value of 40 dB has proven to be successful as threshold value for an attenuation of respective frequencies since with an intensity below this threshold value, an influence on third-party devices is significantly reduced.

Furthermore, the present invention relates to a modulator for a power electronics system, the modulator comprising at least one control device which is configured to select one switching state of the power electronics system in dependence on a comparison of spectral requirements predetermined by at least one specification and respective frequency spectra of error signals of an output voltage of the power electronics system which in each case correspond to a simulated switching state of the power electronics system and to set the one switching state at the power electronics system with constant timing of respective switching rates of the power electronics system from the number of simulated switching states.

In this context, the switching state of the power electronics system is defined by an interaction of respective switching states of power semiconductors comprised by the power electronics system. The power electronics system comprises at least one, as a rule a number of, power semiconductors.

The modulator presented is used in particular for performing the method presented.

In a possible embodiment of the modulator presented, it is provided that the control device is also configured to generate spectral gaps in the frequency spectrum by means of the mathematical function in dependence on the at least one requirement.

By generating "spectral gaps", i.e. attenuating selected frequencies in a frequency spectrum of an error signal of a switching state of a power electronics system, it is possible to operate a respective power electronics system in such a way that respective third-party devices of the vehicle or of a user are not impaired in their operation.

Further advantages and embodiments are obtained from the description and the attached drawings.

Naturally, the features mentioned before and still to be explained in the text which follows can be used not only in the combination specified in each case but also in other combinations or by themselves without departing from the scope of the present invention.

BRIEF DESCRIPTION OF THE DRAWINGS

The invention is presented diagrammatically by means of embodiments in the drawings and will be described in detail and diagrammatically with reference to the drawings.

DETAILED DESCRIPTION OF THE INVENTION

Figure 1:
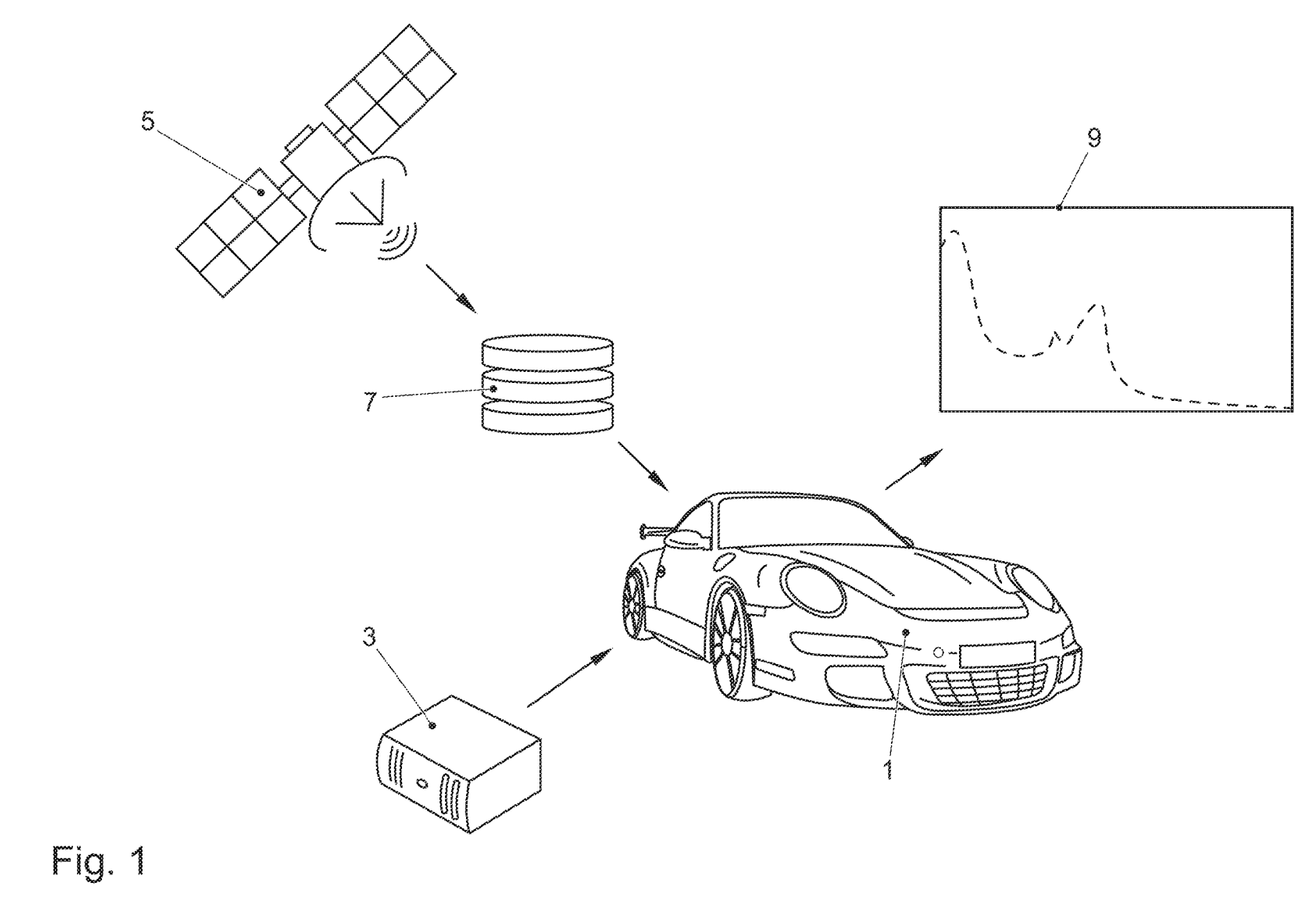
FIG. 1 shows a possible embodiment of the method presented, in which a specification for performing the method presented is selected in dependence on a current position of a respective vehicle.

In FIG. 1, a vehicle 1 is shown which comprises a third-party device in the form of a radio receiver 3 and a power electronics system for controlling an electric motor of the vehicle.

Since the radio receiver 3 is set in dependence on a current position of the vehicle in order to meet, e.g., national specifications, the current position of vehicle 1 is detected by means of a GPS system 5. By means of the current position of vehicle 1, corresponding national specifications are requested from a database 7 and specifications generated for an error signal of an output voltage of the power electronics system. Depending on the specifications, a target value is generated for a spectrum of the error signal of the output voltage of the power electronics system. This target value or a corresponding target spectrum 9, respectively, is used as initial value for a comparison in which all possible switching states of the power electronics system are simulated and examined for their spectral effects on the output voltage of the power electronics system. This means that each frequency spectrum of an error signal of an output voltage generated in accordance with a respective simulated switching state of a power electronics system is compared with the target spectrum 9 and the switching state which produces an output voltage which corresponds to the target spectrum in the best possible way is selected from the number of simulated switching states.

To meet respective requirements, the target spectrum 9 can have, in particular, spectral gaps in which the amplitudes of respective frequencies are attenuated especially strongly.

Figure 2:
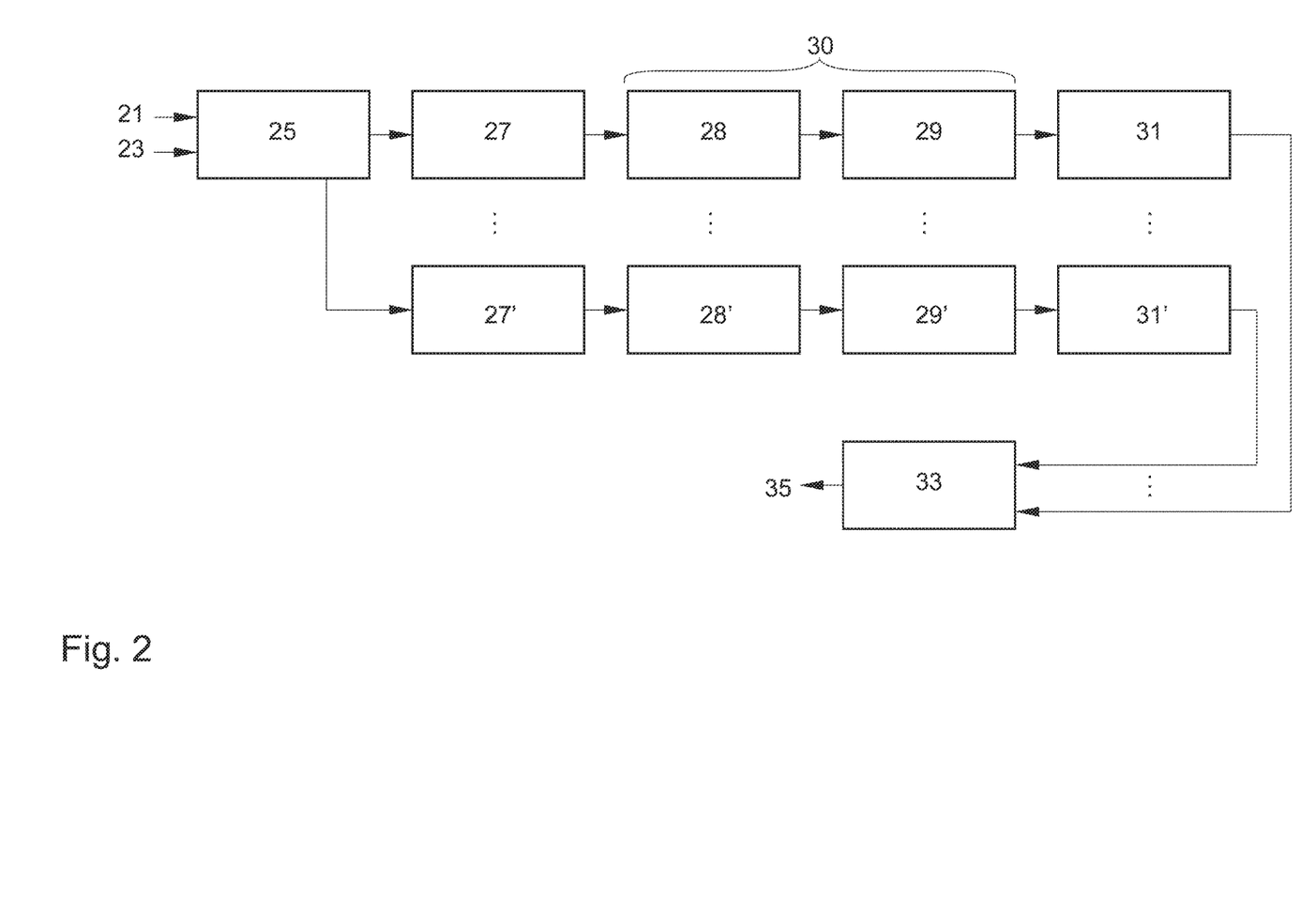
FIG. 2 shows a diagrammatic representation of a sequence of a possible embodiment of the method presented.

In the sequence shown in FIG. 2, nominal values 21 are known from respective specified requirements and past values 23 from a history of switching states of a power electronics system. Starting from the past values 23, all possible alternative switching states of the power electronics system are determined in a step 25 of forming alternatives. For each switching state of the switching states determined in the step 25 of forming alternatives, a corresponding error signal is determined independently of one another in a step 27 or 27', respectively, and in frequency transformation steps 28 and 29 or 28' and 29', in which a Fourier transform of a selected time domain is calculated, is examined for its spectral components. Naturally, the frequency transformation steps 28 and 29 or 28' and 29', respectively, can be combined to form a step 30 by using short-term frequency analyses such as, e.g. Wavelets. To the respective frequency spectra calculated by the frequency transformation steps 28 and 29 or 28' and 29', respectively, mathematical functions such as, e.g., filters and/or standard functions selected in a step 31 and 31', respectively, are applied in order to assess their correspondence with respective requirements and to select in a selection step 33 the switching state of the power electronics system which produces an output voltage of the power electronics system which meets the requirements in the best possible way and to set this correspondingly by means of a modulator such as, e.g., a pulse width modulator, in a setting step 35 at the power electronics system. To assess whether a respective frequency spectrum meets a respective requirement in the best possible way, a difference between a spectrum corresponding to the requirement and a respective spectrum which is allocated to a particular switching state from alternative switching states determined in step 25 can be calculated, for example.

A respective switching state of the power electronics system is allocated one or a plurality of configurations of switching states of the power semiconductors comprised by the power electronics system. This means that a respective switching state of the power electronics system is implemented by a particular configuration of switching states of the individual power semiconductors of the power electronics system. In this context, it is conceivable that there are a number of alternative configurations of switching states of these power semiconductors for implementing a switching state of the power electronics system.

Figure 3:
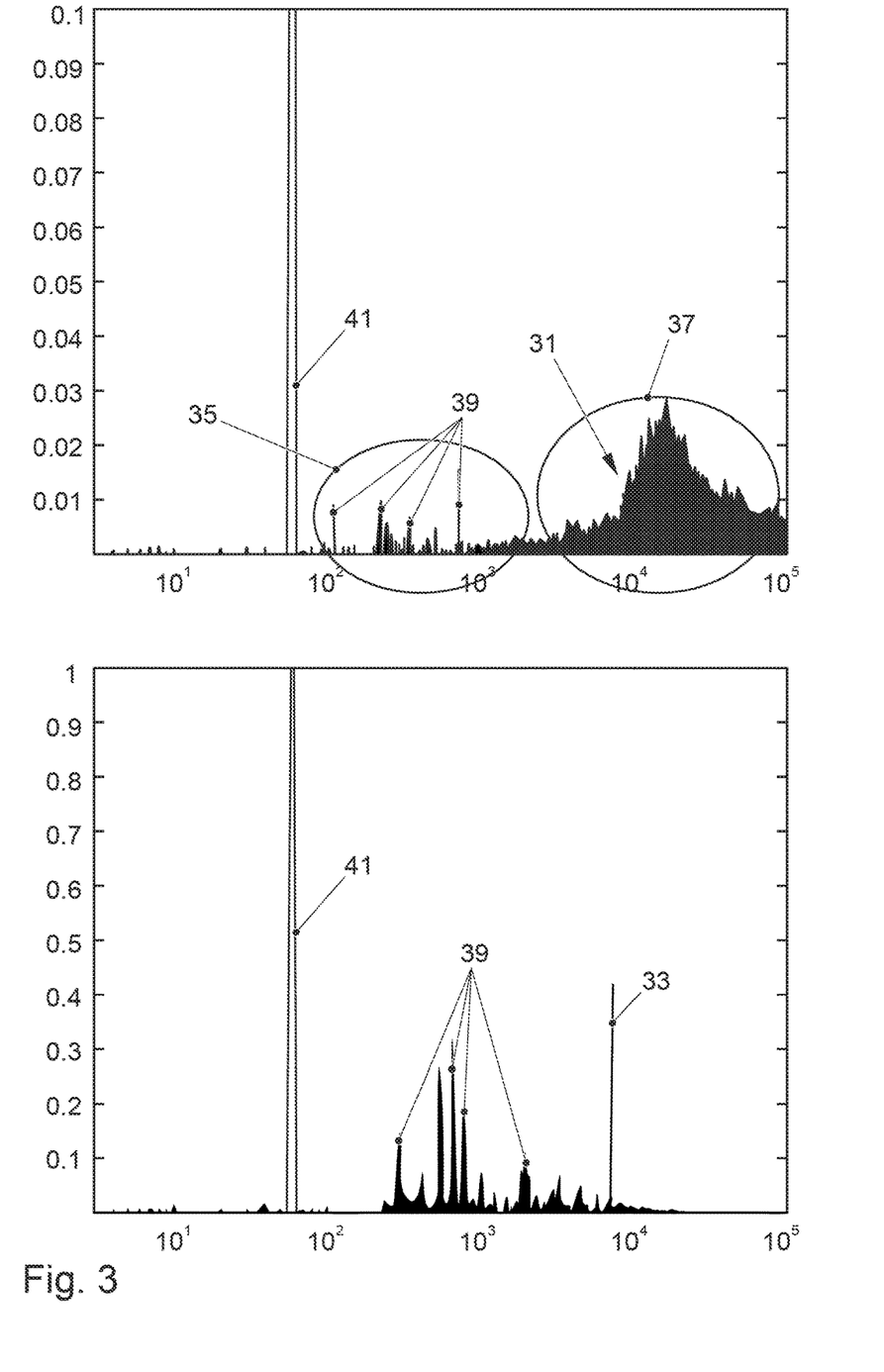
FIG. 3 shows effects of differently selected weighting factors in the calculation of a frequency spectrum of an error signal of an output voltage of a power electronics system according to a possible embodiment of the method presented.

In FIG. 3, a first spectrum 31 and a second spectrum 33 are shown, the first spectrum 31 and the second spectrum 33 being entered in each case in a diagram which extends over a frequency in [Hz] on the abscissa and over a standardized relative amplitude on the ordinate.

The first spectrum 31 shows effects of differently chosen weighting factors on an equation by means of which two requirements are taken into consideration simultaneously in the calculation of a spectrum of an error signal of an output voltage of a power electronics system. By means of the weighting factors, factors of the equation are adapted in accordance with the two requirements in such a manner that a corresponding spectrum corresponds to the two requirements in the best possible way, i.e. shows the least possible deviations from target spectra predetermined by the two requirements. In the present case, the first spectrum 31 shows the effects of the selection of small values in the determination of a first weighting factor so that low frequencies, e.g., are attenuated relatively strongly in a range 35 in comparison with higher frequencies in a range 37. Due to the influence of the second weighting factor, however, a relatively low number of outliers 39 which could lead to disturbances in third-party devices occur in range 35.

Figure 4:
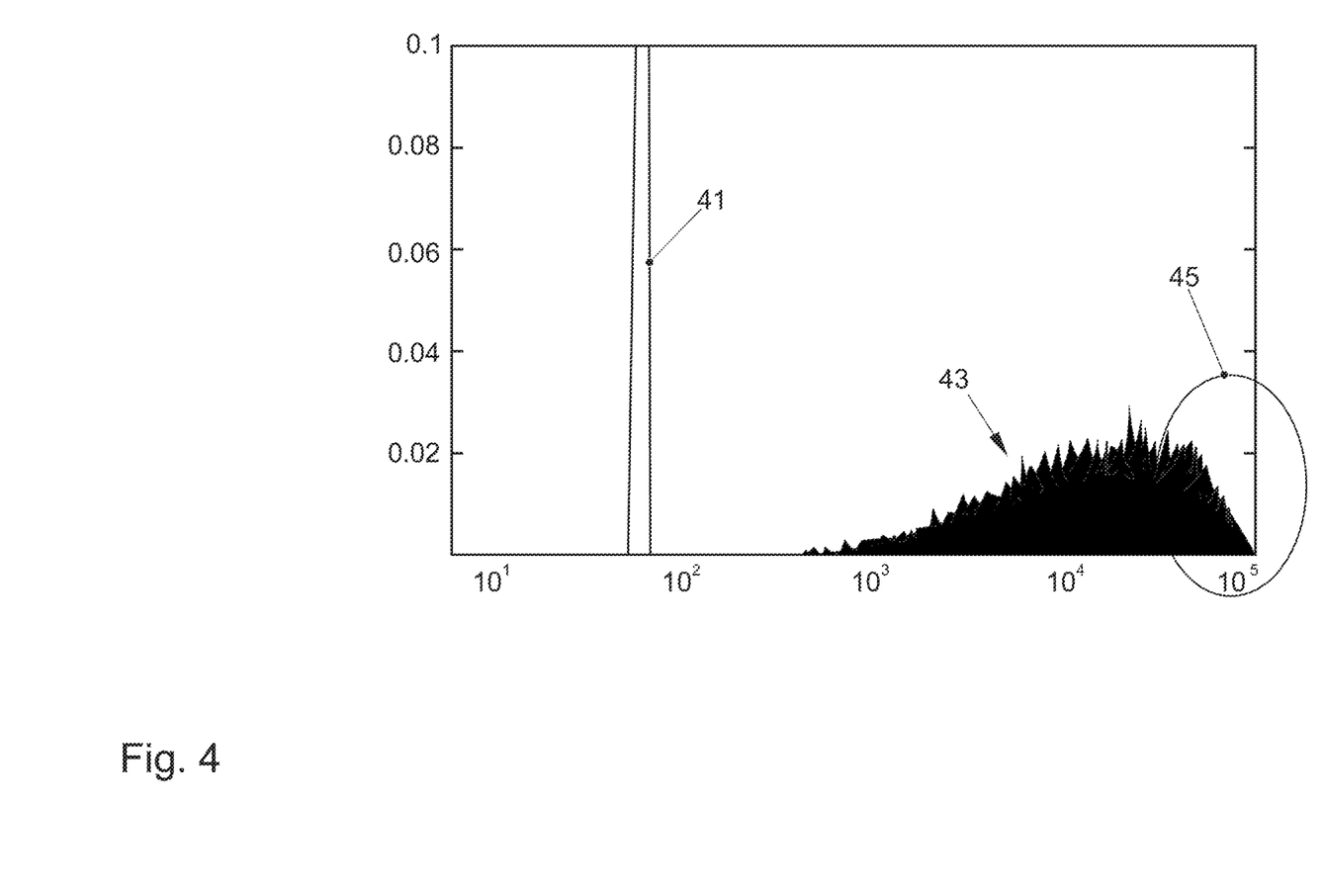
FIG. 4 shows effects of a filter function for superimposing a frequency spectrum of an error signal of an output voltage of a power electronics system according to a further possible embodiment of the method presented.
Figure 5:
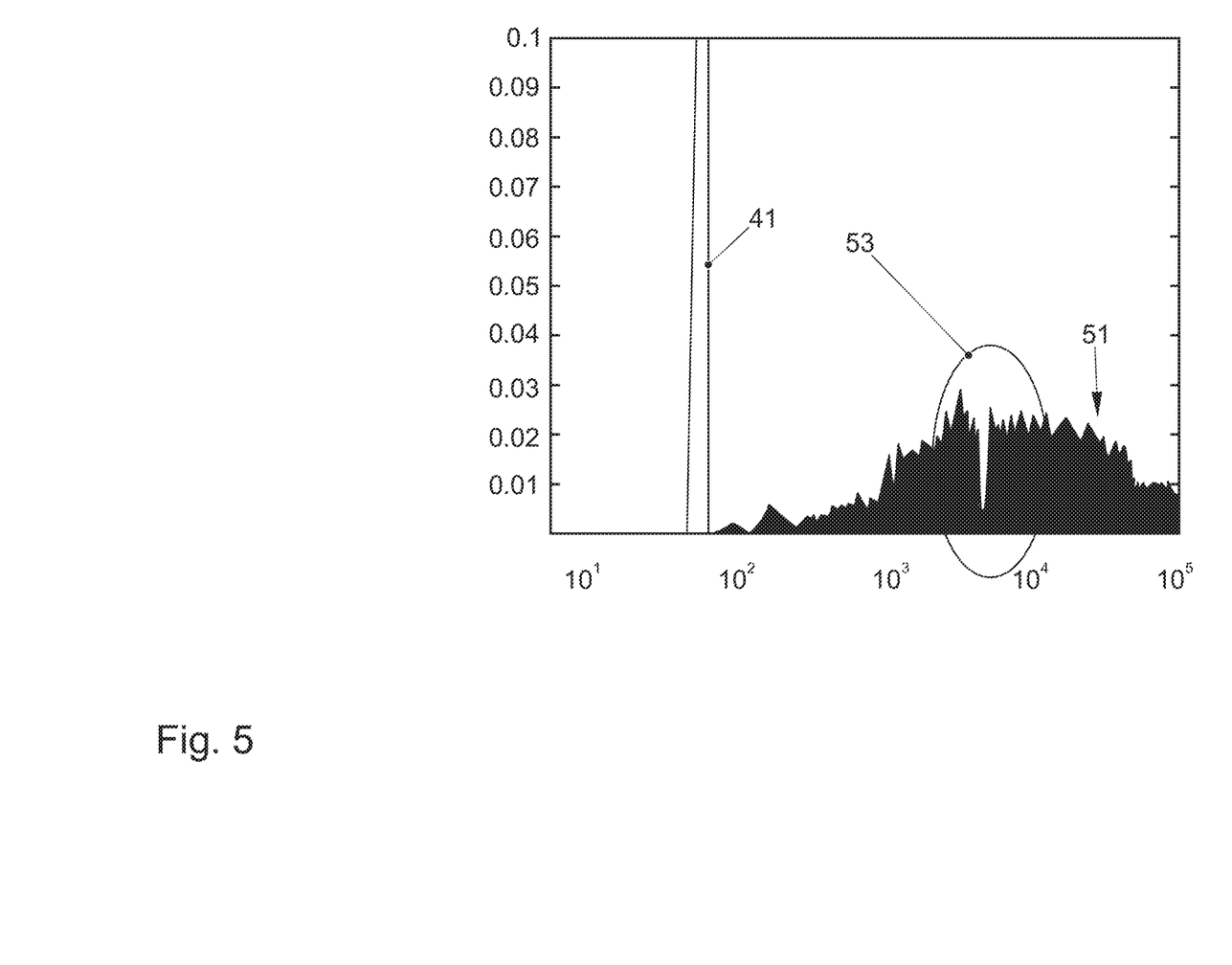
FIG. 5 shows effects of a further filter function for superimposing a frequency spectrum of an error signal of an output voltage of a power electronics system according to a further possible embodiment of the method presented.

The relatively large outlier 41, which can also be seen in FIGS. 4 and 5, results from 50 Hz humming, which is independent of a switching state of the power electronics system and, therefore, is not the subject matter of the examination.

The case that large values are chosen for determining the first weighting factor, so that low values of a respective interference signal are tolerated or, respectively, higher values of the interference signals are attenuated, is shown by the second spectrum 33 which, in particular, is attenuated at high frequencies, wherein individual, very strong outliers 39 occur which could influence third-party devices as interference signals. It has been found that a possibility for reducing the outliers 39 consists in increasing a number of simulation steps of switching states of the power electronics system and, associated therewith, of respective switching states of the power semiconductors, which are taken into consideration in the calculation of the second spectrum 33. This means that a simulation of a multiplicity such as, e.g., 2, 5, 10 or 100 future switching states reduces or minimizes the outliers.

In FIG. 4, a spectrum 43 is shown which has been entered in the diagram which extends over a frequency in [Hz] on the abscissa and over a standardized relative amplitude on the ordinate. By applying a filter function, an error signal on the basis of the spectrum 43 was conditioned in such a manner that the spectrum 43 shows a greatly flattening edge region 45 by which respective interfering frequencies can be filtered out or suppressed in accordance with a respective requirement.

In FIG. 5, a spectrum 51 is shown which was entered in a diagram which extends over a frequency in [Hz] on the abscissa and over a standardized relative amplitude on the ordinate. By applying a mathematical filter function, a range 53 within the spectrum 51 was attenuated with a width of approx. 400 Hz at approx. 5000 Hz in order to generate a spectral gap in the spectrum 51 so that a third-party device, which is sensitive to interference signals in the range of 5000 Hz can be operated undisturbed in parallel with a correspondingly controlled power electronics system.

What is claimed is:

1. A method for controlling a power electronics system for a vehicle, the method comprising:
    selecting one switching state of the power electronics system from a number of possible switching states of the power electronics system in dependence on at least one pre-determined requirement for spectral characteristics of an error signal of an output voltage of the power electronics system, while maintaining a current timing of a modulator of the power electronics system, and
    setting the selected switching state in the power electronics system.

2. The method as claimed in claim 1, further comprising choosing the at least one pre-determined requirement in dependence on a current position of the vehicle.

3. The method as claimed in claim 1, further comprising choosing the at least one pre-determined requirement in dependence on at least one vehicle parameter of the vehicle.

4. The method as claimed in claim 1, further comprising specifying the at least one pre-determined requirement by a device comprising either the vehicle or a device allocated to a user.

5. The method as claimed in claim 1, in which all possible switching states of the power electronics system are simulated and checked for their influence on a change of a frequency spectrum of the error signal of the output voltage of the power electronics system in a predetermined time domain and wherein, from the simulated switching states, the switching state which closest meets the at least one pre-determined requirement is selected for implementation in the power electronics system and set in the power electronics system.

6. The method as claimed in claim 5, in which the error signal of each simulated switching state of the power electronics system is preprocessed by a sigma/delta modulation in order to determine a suitability of a respective switching state of the power electronics system for meeting the at least one pre-determined requirement, an exponentially decreasing window function being chosen as integrator element of the sigma/delta modulation in order to reduce an influence of respective preceding switching states of the power electronics system on the change of the error signal and to suppress oscillations.

7. The method as claimed in claim 5, in which for a case that a number of requirements are specified, the method comprises determining a target spectrum by at least one predetermined weighting factor, and using the target spectrum for a selection of a respective switching state of the power electronics system from the possible simulated switching states of the power electronics system.

8. The method as claimed in claim 5, further comprising preprocessing the error signal of the output voltage of the power electronics system by a filter function in order to determine a suitability of a respective switching state of the power electronics system for meeting the at least one pre-determined requirement.

9. The method as claimed in claim 8, further comprising choosing a cut-off function falling inversely proportionally for high frequencies at respective amplitudes of a number of selected frequencies as the filter function.

10. The method as claimed in claim 9, further comprising reducing selected values of the frequency spectrum in their amplitude below a predetermined threshold value by a mathematical function.

11. The method as claimed in claim 10, further comprising choosing an amplitude of 40 dB as the predetermined threshold value.

12. A modulator for a power electronics system, the modulator comprising:
at least one control device which is configured to select one switching state of the power electronics system from a number of simulated switching states in dependence on a comparison of at least one pre-determined requirement of spectral characteristics of an error signal of an output voltage of the power electronics system with respective frequency spectra of error signals of an output voltage of the power electronics system which, in each case, correspond to a simulated switching state of the power electronics system and to set the one switching state at the power electronics system with constant timing of respective switching rates of the power electronics system.

13. The modulator as claimed in claim 12, the control device furthermore being configured to generate spectral gaps in a respective frequency spectrum by at least one mathematical function in dependence on the at least one pre-determined requirement.

* * * * *